(12) United States Patent
Chen et al.

(10) Patent No.: US 10,651,825 B2
(45) Date of Patent: May 12, 2020

(54) RESISTOR-BASED ATTENUATOR SYSTEMS

(71) Applicant: MEDIATEK Singapore Pte. Ltd., Singapore (SG)

(72) Inventors: E-Hung Chen, Irvine, CA (US); Tamer Mohammed Ali, Irvine, CA (US); Ahmed Othman Mohamed Mohamed ElShater, Corvallis, OR (US); Mazen Soliman Shawky Soliman, Cupertino, CA (US)

(73) Assignee: MEDIATEK Singapore Pte. Ltd., Singapore (SG)

( * ) Notice: Subject to any disclaimer, the term of this patent is extended or adjusted under 35 U.S.C. 154(b) by 0 days.

(21) Appl. No.: 16/362,499

(22) Filed: Mar. 22, 2019

(65) Prior Publication Data
US 2019/0305758 A1 Oct. 3, 2019

Related U.S. Application Data

(60) Provisional application No. 62/651,783, filed on Apr. 3, 2018, provisional application No. 62/651,786, filed on Apr. 3, 2018.

(51) Int. Cl.
*H03H 11/24* (2006.01)
*H01C 1/16* (2006.01)
(Continued)

(52) U.S. Cl.
CPC ............ *H03H 11/245* (2013.01); *H01C 1/16* (2013.01); *H02M 3/07* (2013.01); *H03K 19/018507* (2013.01)

(58) Field of Classification Search
None
See application file for complete search history.

(56) References Cited

U.S. PATENT DOCUMENTS

| 5,049,841 A | 9/1991 | Cooper et al. |
| 5,412,263 A | 5/1995 | Nagaraj et al. |
| (Continued) | | |

FOREIGN PATENT DOCUMENTS

WO    WO 89/11166 A1    11/1989

OTHER PUBLICATIONS

Partial European Search Report dated Sep. 9, 2019 in connection with European Application No. 19165918.4.
(Continued)

*Primary Examiner* — Jeffery S Zweizig
(74) *Attorney, Agent, or Firm* — Wolf, Greenfield & Sacks, P.C.

(57) ABSTRACT

An attenuator system comprising a variable impedance configured to provide an impedance from among a plurality of impedance states, the variable impedance comprising a first port, a second port, a first transistor comprising first and second channel terminals coupled between the first port and the second port, and a second transistor comprising first and second channel terminals coupled between the first port and the second port, and a control circuit configured to control the variable impedance to a first impedance state of the plurality of impedance states at least in part by providing a first output voltage to a control terminal of the first transistor to turn the first transistor on, wherein the first transistor is configured to operate in an under-driven mode when turned on.

19 Claims, 7 Drawing Sheets

(51) Int. Cl.
*H02M 3/07* (2006.01)
*H03K 19/0185* (2006.01)

(56) References Cited

U.S. PATENT DOCUMENTS

| | | |
|---|---|---|
| 7,205,817 B1 | 4/2007 | Huang et al. |
| 7,889,006 B1 * | 2/2011 | Jones ................ H03F 3/45098 330/254 |
| 8,903,344 B2 | 12/2014 | Yan et al. |
| 2007/0216482 A1 | 9/2007 | Hollenbeck et al. |
| 2009/0184785 A1 | 7/2009 | Zhao et al. |

OTHER PUBLICATIONS

Lizama et al., 1-6 GHz GaAs MMIC Linear Attenuator with Integral Drivers, Microwave Symposium Digest, 1987 IEEE MTT-S International, May 9, 1987, pp. 97-99.
Extended European Search Report for European Application No. 19165918.4 dated Dec. 13, 2019.

* cited by examiner

RESISTOR-BASED ATTENUATOR SYSTEMS

CROSS REFERENCE TO RELATED APPLICATIONS

This application is a non-provisional of U.S. Provisional Application Ser. No. 62/651,783 titled "RESISTOR-BASED ATTENUATOR SUPPORTS DC-COUPLED OPERATION AND USES CORE DEVICE AS SWITCH IN RECEIVER FRONT-END," filed Apr. 3, 2018 and U.S. Provisional Application Ser. No. 62/651,786 titled "HIGH BANDWIDTH RESISTOR-BASED ATTENUATOR SUPPORTS DC-COUPLED OPERATION IN RECEIVER FRONT-END," filed Apr. 3, 2018, each of which is incorporated herein by reference in its entirety.

FIELD OF THE DISCLOSURE

The techniques described herein relate to attenuator systems, such as resistor-based attenuator systems.

BACKGROUND

Attenuators are devices that are configured to attenuate an input signal. Attenuators may be implemented as variable attenuators that provide a variable amount of attenuation. These variable attenuators are typically implemented using one or more variable impedances. The variable impedances may be formed using an array of resistors coupled in parallel. Each of the resistors may be coupled in series with a transistor. A state of each of the transistors in the array of resistors may be changed between being on and being off to adjust the amount of attenuation applied to the input signal.

BRIEF SUMMARY

Some embodiments relate to an attenuator system comprising a variable impedance configured to provide an impedance from among a plurality of impedance states and a control circuit. The variable impedance may comprise a first port, a second port, a first transistor comprising first and second channel terminals coupled between the first port and the second port, and a second transistor comprising first and second channel terminals coupled between the first port and the second port. The control circuit may be configured to control the variable impedance to a first impedance state of the plurality of impedance states at least in part by providing a first output voltage to a control terminal of the first transistor to turn the first transistor on. The first transistor may be configured to operate in an under-driven mode when turned on.

In some embodiments, when the first transistor is turned on, the first output voltage may be either higher than voltages at each of the first and second channel terminals at least by a threshold voltage level of the first transistor, or lower than voltages at each of the first and second channel terminals at least by a threshold voltage level of the first transistor.

In some embodiments, in the under-driven mode, a channel impedance of the first transistor may be set by the first output voltage, the channel impedance varying by less than 5% with changes to a voltage across a channel of the first transistor.

In some embodiments, the first transistor may be a field effect transistor, and the under-driven mode may be a triode mode.

In some embodiments, the variable impedance may comprise a plurality of transistors including the first and second transistors, and the plurality of transistors may be sized such that channel impedances of the plurality of transistors constitute at least 95% of a total impedance of the variable impedance when at least some of the plurality of transistors are turned on.

In some embodiments, the control circuit may be configured to control the variable impedance to a second impedance state of the plurality of impedance states at least in part by providing a second output voltage to the control terminal of the first transistor to turn the first transistor off.

Some embodiments relate to an attenuator system comprising a variable impedance configured to provide an impedance from among a plurality of impedance states and a control circuit. The variable impedance may comprise a first port, a second port, a first switched impedance coupled between the first port and the second port, the first switched impedance comprising a first transistor, and a second switched impedance coupled between the first port and the second port and coupled in parallel with the first switched impedance, the second switched impedance comprising a second transistor. The control circuit may be configured to control the variable impedance to an impedance state of the plurality of impedance states at least in part by providing a first output voltage to a control terminal of the first transistor to turn the first transistor on. The first transistor may be configured to have a channel impedance constituting at least 10% of a total impedance of the first switched impedance when the first transistor is turned on.

In some embodiments, the control circuit may be further configured to provide the first output voltage to the control terminal of the first transistor causing the first transistor to operate in a triode mode.

In some embodiments, the control circuit may be further configured to control the variable impedance to a second impedance state of the plurality of impedance states at least in part by providing a second output voltage to the control terminal of the first transistor that causes the first transistor to operate in a cut-off mode, and to control the variable impedance to a third impedance state of the plurality of impedance states at least in part by providing the first output voltage to a control terminal of the second transistor to cause the second transistor to operate in the triode mode.

In some embodiments, the first and second switched impedances may be configured such that, when the first output voltage is applied to the control terminals of the first and second transistors, the first transistor has a channel impedance that is different from a channel impedance of the second transistor by at least 50%.

In some embodiments, the attenuator system may further comprise a reference circuit having a reference impedance, an amplifier, and a reference transistor. The amplifier may be coupled to the reference transistor and the reference impedance and configured to set and maintain a bias of the reference transistor such that the channel impedance of the reference transistor is within 5% of the reference impedance. The reference circuit may be coupled to the control circuit and configured to set the first output voltage based on the bias of the reference transistor.

Some embodiments relate to an attenuator system comprising an input configured to receive an input signal, an output configured to provide an output signal, an impedance network coupled between the input and the output and configured to generate the output signal at least in part by attenuating the input signal, and a control circuit. The impedance network may comprise a first variable impedance comprising a first transistor and configured to have a first variable impedance topology, and a second variable impedance comprising a second transistor and configured to have a second variable impedance topology. The control circuit may be coupled to the impedance network and configured to control an impedance of the first variable impedance and the second variable impedance.

In some embodiments, the first variable impedance may comprise first and second transistors coupled in parallel between first and second ports of the first variable impedance, and may be configured to provide an impedance from among a first plurality of impedance states. The second variable impedance may comprise first and second transistors coupled in parallel between first and second ports of the second variable impedance, and may be configured to provide an impedance from among a second plurality of impedance states.

In some embodiments, the control circuit may be configured to control the first variable impedance to a first impedance state of the first plurality of impedance states at least in part by providing a first output voltage to a control terminal of the transistor of the first switched impedance that causes the transistor to operate in a triode mode. The control circuit may be further configured to control the second variable impedance to a first impedance state of the second plurality of impedance states at least in part by providing the first output voltage to a control terminal of the first transistor of the second variable impedance that causes the first transistor to operate in a triode mode.

In some embodiments, the control circuit may comprise a first charge pump circuit configured to generate the first output voltage and a second charge pump circuit configured to generate the second output voltage.

In some embodiments, the control circuit may comprise a level shifter coupled to the first charge pump circuit and the second charge pump circuit, the level shifter being configured to selectively output the first output voltage or the second output voltage to the control terminals of the first transistors of the first variable impedance and of the second variable impedance.

In some embodiments, the first variable impedance may further comprise a first switched impedance, the first switched impedance comprising the first transistor coupled in series with an impedance. A channel impedance of the first transistor, when the first transistor is turned on, may constitute at least 10% of a total impedance of the first switched impedance.

In some embodiments, second variable impedance may further comprise a plurality of transistors including the first and second transistors.

The plurality of transistors may be sized such that, when at least some of the plurality of transistors are turned on, channel impedances of the plurality of transistors constitute at least 95% of a total impedance of the second variable impedance.

In some embodiments, the impedance network may further comprise a third variable impedance configured to provide an impedance from among a third plurality of impedance states, the third variable impedance configured to have a third variable impedance topology different from the first and second variable impedance topologies.

In some embodiments, the first variable impedance, the second variable impedance, and the third variable impedance may be arranged in a pi pad topology or a T pad topology.

The foregoing summary is provided by way of illustration and is not intended to be limiting.

BRIEF DESCRIPTION OF DRAWINGS

In the drawings, each identical or nearly identical component that is illustrated in various figures is represented by a like reference character. For purposes of clarity, not every component may be labeled in every drawing. The drawings are not necessarily drawn to scale, with emphasis instead being placed on illustrating various aspects of the techniques and devices described herein.

DETAILED DESCRIPTION

Figure 1:
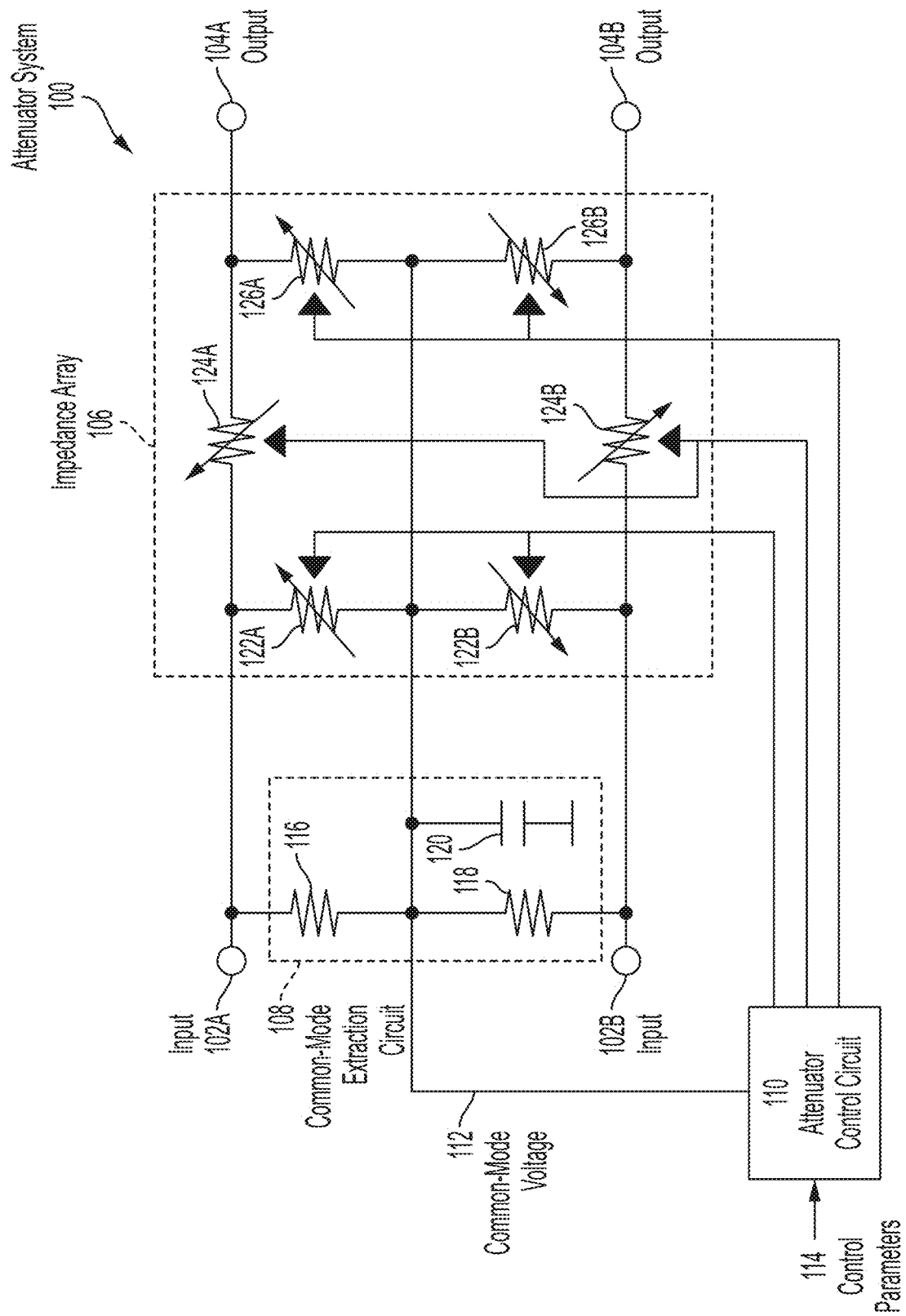
FIG. 1 is a schematic for an example attenuator system, according to some embodiments.

As described above, conventional attenuators employ an array of resistors, each resistor being series coupled with a transistor, to implement variable impedances. The inventors have appreciated that the arrays of resistors are typically designed such that the transistor has minimal (if any) resistance when the transistor is turned on. For example, the transistors may be designed to have an on-state impedance that provides no more than 10% of the total impedance of the switched resistor. To minimize the on-state impedance of the transistors, the transistors have a large area and are driven deep into the saturation region. As a result of these large transistors, the size of the variable impedances in the attenuator is substantial. Further, the large capacitance (e.g., between gate and drain or between base and collector) caused by these large transistors reduces the usable bandwidth of the attenuator by limiting operation at high frequencies.

Accordingly, aspects of the present disclosure relate to attenuator systems that may employ variable impedances with substantially smaller transistors than conventional variable impedances. As a result, the total size of the attenuator systems may be reduced and the bandwidth of the attenuator may be increased. For example, the attenuator systems described herein may employ transistors that are between 15 times and 45 times smaller than the transistors employed in conventional attenuator systems. In some embodiments, the attenuator systems described herein employ the transistors in the variable impedances to provide a non-insignificant portion of the total impedance of the variable impedance when the transistor is turned-on. For example, the transistor may provide at least 10% of the total impedance of the variable impedance when the switched impedance is turned on.

The inventors have recognized and appreciated that transistors included in conventional variable impedances, which are driven into the saturation region, may be configured to have a channel impedance that varies substantially with the voltage across the channel of the transistor, but the channel impedance of the transistors may be so small that the variation is negligible compared to an overall impedance of the conventional variable impedance. In contrast, transistors described herein may contribute a non-insignificant portion of the overall impedance of the variable impedance such that variation in channel impedances of the transistors may be substantial.

Accordingly, a transistor employed in a variable impedance of an attenuator system described herein may be configured to operate in an under-driven mode (e.g. triode mode for a field effect transistor or saturation mode for a bipolar junction transistor) when turned on, where the voltage at a control terminal of the device is either higher than at each of the channel terminals of the transistor (e.g., for an n-channel device such as an nMOS or NPN transistor), or lower than at each of the channel terminals (e.g., for a p-channel device such as a pMOS or a PNP transistor) by at least a threshold voltage level of the transistor. It should be appreciated that a threshold voltage level of a transistor may depend on a number of factors, such as the size of the device and semiconductor materials used to fabricate the device. As described herein, the threshold voltage level of a transistor is the voltage level at which a semiconductor junction (e.g., such as a diode junction) of the transistor is forward biased. For devices having multiple semiconductor junctions formed of different sizes and/or materials (e.g., a heterojunction bipolar transistor), multiple different threshold voltages may correspond to each semiconductor junction of the transistor.

When configured to operate in the under-driven mode, a substantially constant channel impedance of the transistor may be set by a bias voltage and/or current provided to the control terminal of the transistor. The channel impedance may be substantially constant in the under-driven mode, due to the channel impedance being substantially independent of the voltage across the channel. For example, an nMOS field effect transistor (n-MOSFET) configured to operate in triode mode may have a gate terminal coupled to a higher bias voltage than each of the drain and source terminals of the transistor. Accordingly, a channel impedance of the transistor (e.g., a resistance between the drain and the source) may be set by the gate voltage, the channel impedance being substantially independent of the voltage across the channel of the transistor. Accordingly, the transistor may exhibit a substantially constant channel impedance so long as the transistor is configured to operate in the triode mode. In some embodiments, a transistor operated in an under-driven mode may have a channel impedance set by a voltage at a control terminal of the transistor, the channel impedance varying less than 5% with changes to a voltage across the channel.

In some embodiments, a transistor bias circuit may be implemented to maintain a desired transistor biasing condition in a variable impedance for use in an attenuator system. For example, a feedback loop incorporating a reference current source and a reference impedance may be used to create and maintain a bias voltage for a control terminal of a transistor of the variable impedance, with the reference current source set to create a desired channel impedance for the transistor of the variable impedance.

In some embodiments, an attenuator system may comprise variable impedances, including transistors operated in either an under-driven mode when turned on or a cut-off mode when turned off, which may be controlled by an attenuator control circuit. The transistors may each receive a voltage signal (e.g., at control terminals of the transistors) from the attenuator control circuit to turn each transistor on or off, resulting in the transistors operating in either the under-driven mode or the cutoff mode. For example, a high voltage signal received at a control terminal of a transistor may cause the transistor to turn on and operate in the under-driven mode, and a low voltage signal may cause the transistor to turn off and operate in the cut-off mode. The transistors may be placed in parallel with one another to receive voltage signals in parallel from the attenuator control circuit, with the operating modes of the transistors determining an impedance state of the parallel transistors. Accordingly, the transistors may be part of a variable impedance with a state of the variable impedance depending on the mode of each transistor.

In some embodiments, the attenuator control circuit may prevent transistors of variable impedances in an attenuator system from deviating from the under-driven mode of operation into an over-driven mode of operation by extracting a common-mode voltage (e.g. via a common-mode extraction circuit) and by incorporating the extracted common-mode voltage when biasing the transistors of the variable impedances (e.g. via a charge pump circuit). For example, the voltage at the input of the variable impedance may swing high, causing a channel voltage of one or more of the transistors to increase beyond an upper limit of the under-driven mode. Accordingly, the transistor may leave the under-driven mode, and the channel impedance of the transistor may no longer be substantially independent of the voltage across the channel. However, if the common-mode voltage of the variable impedance is extracted, for example by a common-mode extraction circuit, the control circuit may incorporate the common-mode voltage during application of the bias voltage. For example, the attenuator control circuit may receive the common-mode voltage and determine that the desired biasing condition of the transistor would cause the transistor to depart from the under-driven mode, and in some embodiments may respond by turning off the transistor (e.g., switching the transistor into the cut-off mode).

The inventors have recognized and appreciated that some variable impedances in an attenuator system may be exposed to a higher voltage swing than other variable impedances in the attenuator system. For example, a variable impedance coupled to an input of the attenuator system may be exposed to a higher voltage swing than a variable impedance coupled to an output of the attenuator system, the latter of which may be exposed to an attenuated version of a signal received at the input. Accordingly, variable impedances in attenuator systems described herein may have different topologies from one another either to increase a voltage swing level to which the variable impedance may be exposed while transistors thereof maintain substantially constant channel impedances, or to reduce a size and to increase an operating bandwidth of the variable impedances which are exposed to a smaller voltage swing. For example, a first variable impedance exposed to a high voltage swing may include switched impedances having impedances coupled in series with transistors such that the transistors are exposed to only a portion of the high voltage swing to which the switched impedances are exposed. A second variable impedance exposed to a smaller voltage swing may include transistors coupled in parallel with an impedance rather than in series such that fewer impedances are included in the variable impedance for a reduced size and an increased operating bandwidth of the variable impedance. A third variable impedance exposed to an even smaller voltage swing may not include impedances coupled to the transistors, such that a size of the variable impedance may be further reduced and the operating bandwidth of the variable impedance may be further increased.

Turning now to the figures, FIG. 1 shows an example attenuator system 100 that receives an input signal at inputs 102A and/or 102B and provides an attenuated output signal at outputs 104A and/or 104B. The input and output signals may include radio-frequency (RF) signals, for example, received from a receive antenna of an RF front-end system. The signal applied to the attenuator system 100 may be, for example, a differential signal. In such an implementation, the input 102A may be a first differential input and the input 102B may be a second differential input. Similarly, the output 104A may be a first differential output and the output 104B may be a second differential output. As shown in FIG. 1, the attenuator system comprises an impedance array 106 that is configured to attenuate the input signal and comprises a plurality of variable impedances 122A, 122B, 124A, 124B, 126A, and 126B. The attenuator system 100 further comprises a common-mode extraction circuit 108 that is coupled to the impedance array 106 and configured to extract a common mode voltage 112. In turn, the common-mode voltage 112 may be provided as an input to an attenuator control circuit 110. The attenuator control circuit 110 may employ the common-mode voltage 112 alone or in combination with control parameters 114 to generate control signals for the variable impedances 122A, 122B, 124A, 124B, 126A, and 126B in the impedance array 106.

The impedance array 106 may be configured to apply a variable amount of attenuation to the input signal received at the inputs 102A and/or 102B. The impedance array 106 comprises a network of variable impedances shown as variable impedances 122A, 122B, 124A, 124B, 126A, and 126B arranged in any of a variety of configurations such as a Pi-network (e.g., a Pi pad) or a T-network (e.g., a T pad). As shown, the set of variable impedances 122A, 124A, and 126A form a first Pi-network and the set of variable impedances 122B, 124B, and 126B form a second Pi-network. In particular, variable impedances 122A and 122B are coupled in series between the inputs 102A and 102B, the variable impedance 124A is coupled between the input 102A and output 104A, the variable impedance 124B is coupled between the input 102B and the output 104B, and the variable impedances 126A and 126B are coupled in series between the outputs 104A and 104B.

The first and second Pi-networks may be controlled in concert so as to attenuate the input signal without introducing distortion. For example, an impedance of the variable impedances 122A and 122B may be adjusted in concert to be the same (or substantially the same). Similarly, an impedance of the variable impedances 124A and 124B may also be adjusted to be the same (or substantially the same). In addition, an impedance of the variable impedances 126A and 126B may also be adjusted to be the same (or substantially the same).

The amount of attenuation applied by the impedance array 106 to the input signal and/or an input impedance of the impedance array 106 may be changed by adjusting an impedance of the variable impedances 122A, 122B, 124A, 124B, 126A, and 126B. In cases where the impedances of 122A and 122B match, 124A and 124B match, and 126A and 126B match, the gain of the impedance array may be represented by equation (1) below and the input impedance of the array may be represented by equation (2) below.

$$\text{Gain} = \frac{R_{126}}{(R_{124} + R_{126})} \quad (1)$$

In equation (1), the parameter $R_{124}$ is the impedance of either the variable impedance 124A or 124B (since their impedances match) and the parameter $R_{126}$ is the impedance of either the variable impedance 126A or 126B (since their impedances also match).

$$\text{Input Impedance} = R_{122} \| (R_{124} + R_{126}) \quad (2)$$

In equation (2), the parameter $R_{122}$ is the impedance of either the variable impedance 122A or 122B (since their impedances match), the parameter $R_{124}$ is the impedance of either the variable impedance 124A or 124B (since their impedances match) and the parameter $R_{126}$ is the impedance of either the variable impedance 126A or 126B (since their impedances also match). Further, the symbol ∥ is the parallel impedance symbol. Thus, equation (2) indicates that the input impedance is equal to the impedance of $R_{122}$ in parallel with the combined impedances of $R_{124}$ and $R_{126}$.

In some embodiments, the construction of the variable impedances 122A, 122B, 124A, 124B, 126A, and 126B may not be identical. In these embodiments, the variable impedances may have different topologies from one another based on whether they are exposed to high voltage swing (e.g. an AC voltage swing centered at the common-mode voltage). For example, it may be desirable for one variable impedance to maintain under-driven operation at a high voltage swing in exchange for having less bandwidth and/or a larger device size. However, it may be desirable for another variable impedance to have more bandwidth and/or a smaller device size rather than under-driven operation at high voltage swing because it may not necessarily even encounter the high voltage swing. Accordingly, variable impedances encountering high voltage swing may have a different construction than variable impedances encountering lower voltages. For example, the variable impedances 122A and 122B may encounter a higher voltage than variable impedances 124A and 124B, and variable impedances 124A and 124B may encounter a higher voltage swing than variable impedances 126A and 126B. As a result, the variable impedances 122A and 122B, variable impedances 124A and 124B, and the variable impedances 126A and 126B may each have a different construction selected to increase their bandwidths and/or reduce their sizes while ensuring under-driven operation at the highest voltage swing they are configured to receive. By tailoring the construction of the variable impedances based on a highest voltage that each variable impedance may encounter, the total size and operational bandwidth of the variable impedance network may be reduced because fewer components that are capable of maintaining under-driven operation at higher voltage swing are needed.

The common-mode extraction circuit 108 may be configured to output the common-mode voltage 112. As shown, the common-mode extraction circuit 108 may comprise a pair of impedances 116 and 118 coupled between the inputs 102A and 102B and a capacitor 120 having a first terminal coupled between the impedances 116 and 118 and a second terminal coupled to a reference potential (e.g., ground). The impedance value of the impedance 116 may match (or substantially match) the impedance value of the impedance 118, and the capacitor 120 may hold a DC voltage between the impedances 116 and 118. Accordingly, a voltage held steady by the capacitor 120 between the pair of impedances 116 and 118 may be the common-mode voltage of the signal input to the attenuator system 100.

The attenuator control circuit 110 may be configured to generate the control signals for the variable impedances 122A, 122B, 124A, 124B, 126A, and 126B based on the common-mode voltage 112 and/or the control parameters 114. Example control parameters 114 may include a desired input impedance value for the impedance array 106 and/or a desired gain of the impedance array 106. In some embodiments, the attenuator control circuit may employ the common-mode voltage 112 to generate a set of output voltages that may be provided to one or more transistors in the variable impedances to control their impedance. In these embodiments, the attenuator control circuit 110 may select which output voltage from the set of output voltages to provide each transistor in the set of variable impedances.

It should be appreciated that the example attenuator system 100 may be implemented as a single-ended system instead of a differential system as shown in FIG. 1. For example, the following components may be removed from the example attenuator system 100 to create a single-ended attenuator system: input 102B, variable impedance 122B, variable impedance 124B, variable impedance 126B, input 102B, output 104B, and resistor 118. Accordingly, the attenuation system 100 may be implemented as either a differential attenuator system or a single-ended attenuator system.

Figure 2A:
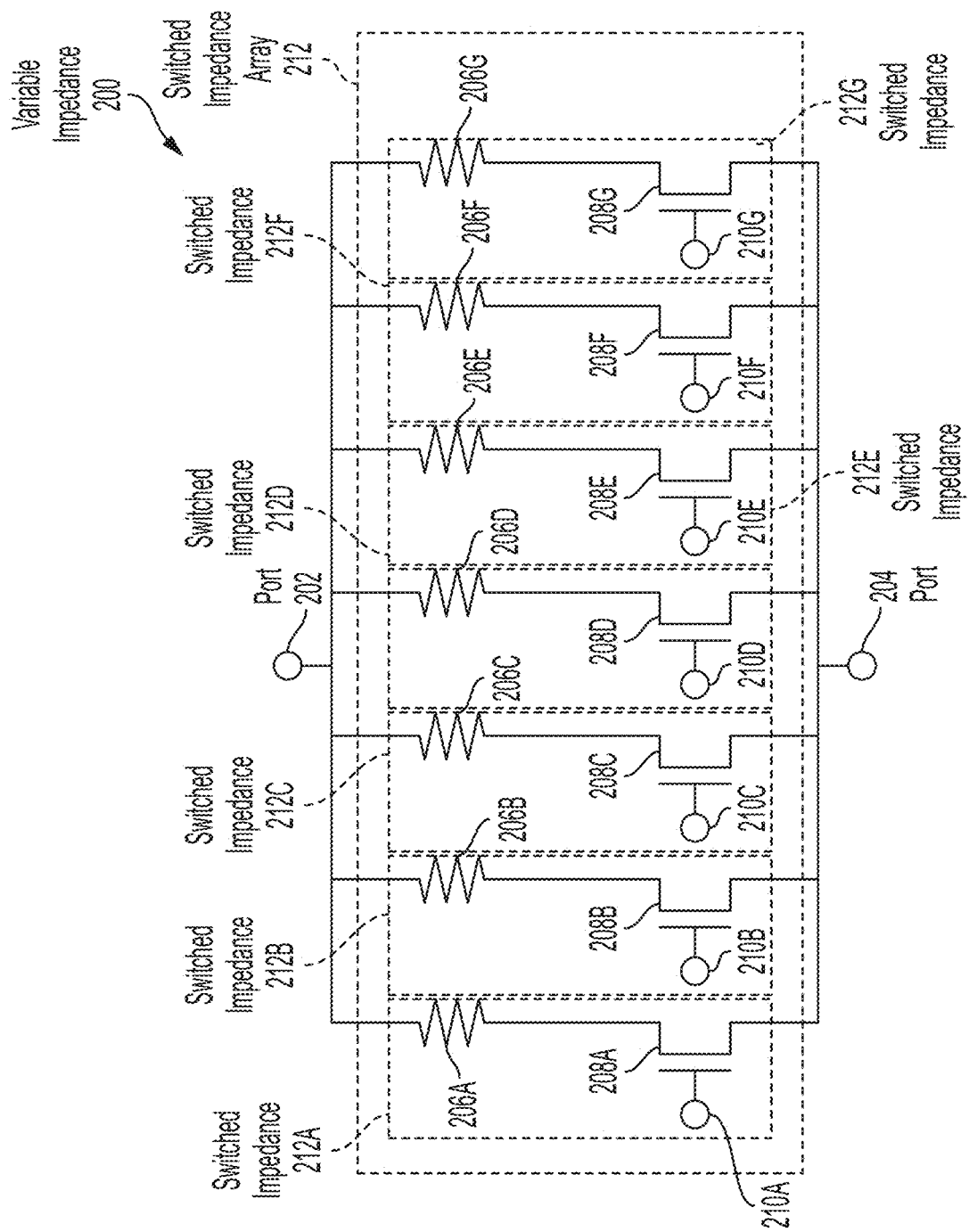
FIG. 2A is a schematic of an example variable impedance, according to some embodiments.

FIG. 2A shows an example variable impedance 200 having a first variable impedance topology that may be employed as any one or more of variable impedances 122A, 122B, 124A, 124B, 126A, and 126B in attenuator system 100. For example, the variable impedance 200 may be employed as variable impedances 122A and 122B in attenuator system 100. As shown in FIG. 2A, the variable impedance 200 comprises a switched impedance array 212 coupled between a first port 202 and a second port 204. The switched impedance array 212 comprises a plurality of switched impedances 212A-212G that are coupled in parallel. Each of the switched impedances 212A-212G comprises a transistor (shown as transistors 208A-208G) coupled in series with an impedance (shown as impedances 206A-206G). Each of the transistors 208A-208G include a control terminal 210A-210G (e.g., gate or base terminal), respectively, that is configured to receive a control signal (e.g., from attenuator control circuit 110).

The variable impedance 200 is configured with multiple impedance states corresponding to multiple possible impedances between the first port 202 and the second port 204. An impedance state may be selected from the multiple impedance states based on corresponding control signals received from the attenuator control circuit 110. For example, the variable impedance 200 may receive a first control signal causing a first transistor to receive a logic high voltage signal and causing a second transistor to receive a logic low voltage signal. The first transistor may turn on and the second transistor may turn off, resulting in a first impedance state of the variable impedance 200. Alternatively, the variable impedance 200 may receive a second control signal causing the first transistor to receive a logic low voltage signal and causing the second transistor to receive a logic high voltage signal. The first transistor may turn off and the second transistor may turn on, resulting in a second impedance state.

The control signal for each of transistors 208A-208G may have a voltage that varies between a plurality of levels to drive the respective transistor into a particular mode of operation such as cut-off mode, under-driven mode, and over-driven mode. For example, transistors 208A-208G may include FETs having modes of operation such as a cut-off mode of operation (e.g., turned off) where the gate-source voltage is smaller than the threshold voltage, an under-driven mode (e.g., triode mode) of operation where the gate-source voltage is larger than the threshold voltage and the drain-source voltage is less than the gate-source voltage minus the threshold voltage, and an over-driven mode (e.g., saturation mode) of operation where the gate-source voltage is larger than the threshold voltage and the drain-source voltage is larger than the gate-source voltage minus the threshold voltage. In driving a transistor into a particular mode of operation, the control signal to the transistor may have a first voltage level that causes the transistor to enter a cut-off mode of operation to stop the flow of current in a particular switched impedance and, as a result, increase the impedance of the variable impedance 200. Conversely, the control signal to a particular transistor may have a second voltage level that causes the transistor to enter an under-driven mode of operation to allow the flow of current through a particular switched impedance and, as a result, decrease the impedance of the variable impedance 200.

Each of the transistors 208A-208G may have a different size, allowing for different channel impedances of the transistors 208A-208G. In some embodiments, different channel impedances of the transistors 208A-208G may allow for patterned arrangement of the transistors 208A-208G based on channel impedance, such as by a binary increment. For example, in FIG. 2A, the transistor 208C may be twice as large as the transistor 208B, and the transistor 208D may be twice as large as the transistor 208C, and so on. In some embodiments, one or more of the transistors 208A-208G may be sized to have a channel impedance that is at least 50 times greater than that of one or more others of the transistors 208A-208G, and so the range of impedance states of the variable impedance 200 may be set accordingly. In some embodiments, one or more of the transistors 208A-208G may be sized to have a channel impedance that is different from one or more others of the transistors 208A-208G by at least 50%. Control signals sent to the transistors 208A-208G may be calculated to result in a desired overall impedance of the variable impedance 200 based on the sizes and corresponding channel impedances of the transistors 208A-208G. Additionally, in some embodiments, some or each of the transistors 208A-208G may be sized to have a channel impedance that constitutes 10% or more of the overall impedance of the corresponding switched impedance of the switched impedances 212A-212G. It should be appreciated that, in some embodiments, some or all of the transistors 208A-208G may have substantially a same size.

The inventors have recognized and appreciated that the variable impedance 200 may be exposed to a large voltage swing at the first port 202 which may cause the transistors 208A-208G to leave the under-driven mode of operation. For example, the transistors 208A-208G may include one or more FETs operating in an under-driven (e.g., triode) region so long as the drain-source voltage of the FET(s) is below the gate-source voltage by more than a threshold voltage. At smaller voltage swing, the drain and source voltages may be low enough that the under-driven mode is maintained. However, the drain and source voltages may grow large as the voltage swing increases, causing the FET(s) to leave the under-driven mode of operation and enter an over-driven mode of operation. Accordingly, the impedances 206A-206G may be included in the variable impedance 200 to decrease the voltage swing to which the transistors 208A-208G are exposed. Such a configuration may allow for a wider range of voltages to which the variable impedance 200 may be exposed while maintaining operation in the under-driven mode of the transistors 208A-208G.

Figure 2B:
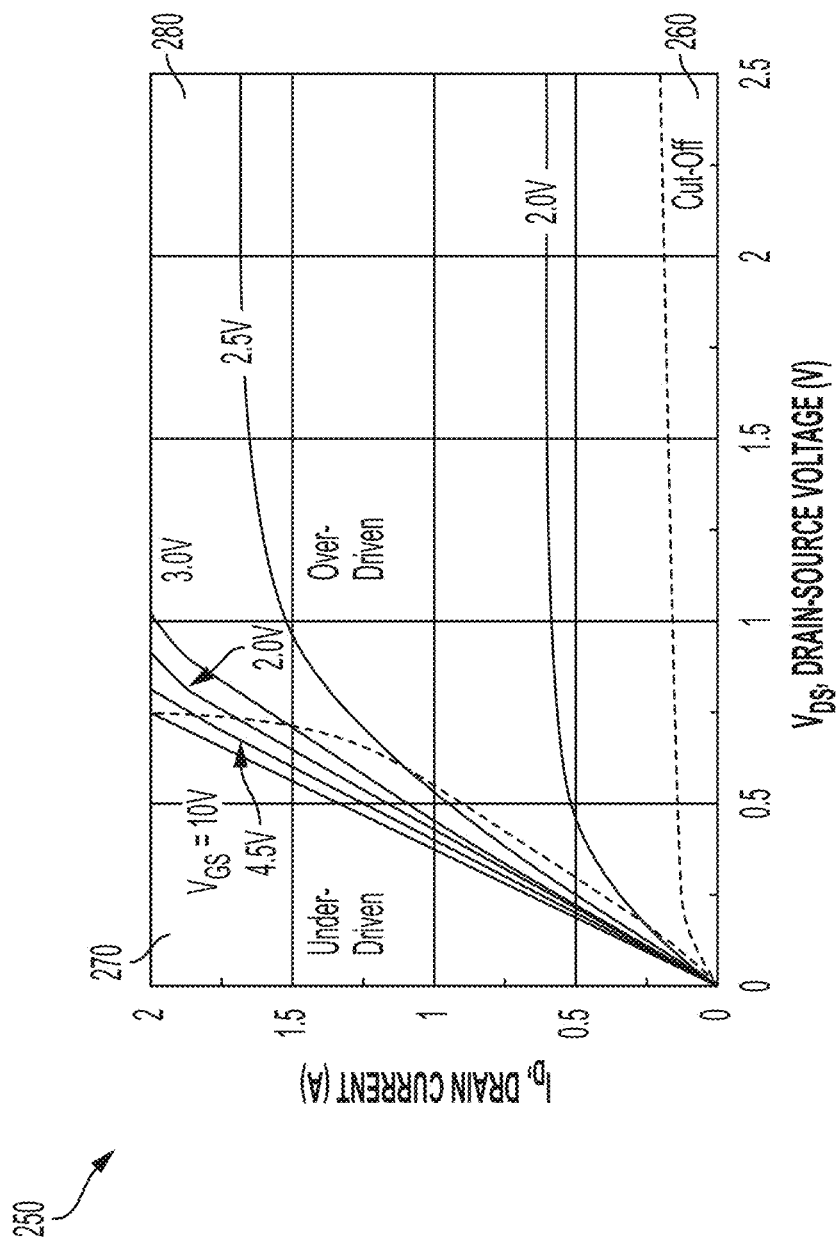
FIG. 2B is a graph illustrating modes of operation of an exemplary transistor included in the variable impedance of FIG. 2A.

FIG. 2B is a graph illustrating modes of operation of an exemplary transistor, such as may be included in the variable impedance 200, as shown in FIG. 2A. Graph 250 plots channel current through a transistor, such as one of transistors 208A-208G, against channel terminal voltage for various control terminal voltages. Graph 250 includes regions 260, 270, and 280, each of which may correspond to a mode of operation of the transistor. Specifically, graph 250 plots drain-source current for a FET against a drain-source voltage of the FET for various gate-source voltages. It should be appreciated that, while graph 250 illustrates operating characteristics of a FET, other devices such as BJTs may be configured to operate in corresponding modes as described herein, for example with an emitter of the BJT corresponding to the source of the FET, and with a collector of the BJT corresponding to the drain of the FET.

Region 260 may correspond to a cut-off mode of operation where the control terminal voltage is not greater than a voltage of a channel terminal of the transistor (e.g., source of a FET or emitter of a BJT) at least by a threshold voltage level of the transistor. For example, region 260 corresponds to a cutoff mode of the FET where the gate voltage is not greater than the source voltage at least by the threshold voltage level of the FET. In the cutoff mode, the gate-source semiconductor junction is not forward biased, and so the FET is turned off.

Region 270 may correspond to an under-driven mode of operation where the control terminal voltage is higher than voltages at each channel terminal of the transistor at least by the threshold voltage level. For example, region 270 corresponds to a triode region of the FET where the gate voltage is greater than each of the source voltage and the drain voltage of the FET at least by the threshold voltage level of the FET. In the triode region, the gate-source semiconductor junction is forward biased, and so the FET is turned on, and the gate-drain semiconductor junction is also forward biased. Accordingly, a channel impedance of the FET may be set by a gate voltage and held substantially constant so long as the FET is configured to operate in the triode mode. A transistor included in the variable impedance 200, such as a FET, may be configured to operate in an under-driven mode, such as in the triode region.

Region 280 may correspond to an over-driven mode of operation where the control terminal voltage is higher than one channel terminal of the transistor (e.g., source or emitter) at least by the threshold voltage level, and is not higher than another channel terminal of the transistor (e.g., drain or collector). For example, region 280 corresponds to a saturation region of the FET where the gate voltage is greater than the source voltage at least by the threshold level of the FET, but the gate voltage is not greater than the drain voltage at least by the threshold level. In the saturation region, the gate-source semiconductor junction is forward biased, and so the FET is turned on, but the gate-drain semiconductor junction is not forward biased. Accordingly, a channel impedance of the FET may vary substantially with changes in drain-source voltage. The variable impedance 200 includes the impedances 206A-206G in order to limit the channel voltage to which the transistors 208A-208G are exposed. Accordingly, the transistors 208A-208G may be prevented from operating in the over-driven mode.

It should be appreciated that, while graph 250 illustrates operating characteristics of an n-channel device, p-channel devices may be configured to operate analogously. For example, in the cut-off mode, the control terminal voltage of the transistor may not be less than a channel terminal (e.g., source or emitter) at least by the threshold voltage level. In the under-driven mode, the control terminal voltage may be lower than voltages at each channel terminal at least by the threshold voltage level. In the over-driven mode, the control terminal may be lower than one channel terminal (e.g., source or emitter) by at least the threshold voltage level, but may not be lower than another channel terminal (e.g., drain or collector) by at least the threshold voltage level.

Figure 3:
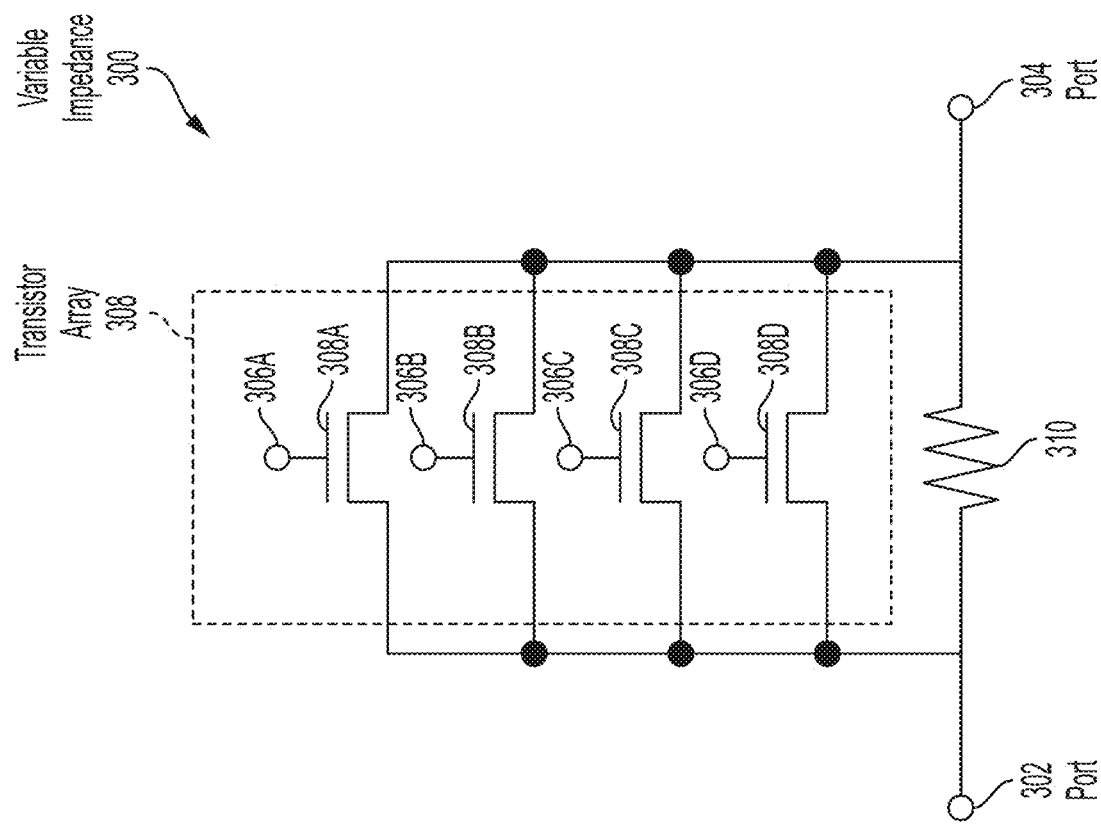
FIG. 3 is a schematic of another example variable impedance, according to some embodiments.

FIG. 3 shows an example variable impedance 300, having a second variable impedance topology different from the first variable impedance topology described in connection with the variable impedance 200, that may be employed as any one or more of variable impedances 122A, 122B, 124A, 124B, 126A, and 126B in attenuator system 100. For example, the variable impedance 300 may be employed as variable impedances 124A and 124B in attenuator system 100. In FIG. 3, the variable impedance 300 comprises a switched impedance array 308 coupled between a first port 302 and a second port 304. The switched impedance array 308 comprises a plurality of transistors 308A-308D that are coupled in parallel, and also coupled in parallel with an impedance 310. In contrast to the variable impedance 200 of FIG. 2A, the transistors 308A-308D of the variable impedance 300 may not be coupled in series with impedances. Each of the transistors 308A-308D include a control terminal 306A-306D, respectively, that is configured to receive a control signal (e.g., from attenuator control circuit 110). The variable impedance 300 is configured with multiple impedance states corresponding to multiple possible impedances between the first port 302 and the second port 304. An impedance state may be selected from the multiple impedance states based on corresponding control signals received from the attenuator control circuit 110.

Similar to the variable impedance 200, the control signal for each of the transistors 308A-308D of the variable impedance 300 may have a voltage that varies between a plurality of levels to drive the respective transistor into a particular mode of operation, such as a cut-off mode of operation, an under-driven mode of operation, and an over-driven mode of operation.

Each of the transistors 308A-308D may have a different size, allowing for a different channel impedance of the transistors 308A-308D. In some embodiments, different channel impedances of the transistors 308A-308D may allow for patterned arrangement of the transistors 308A-308D based on channel impedance, such as by a binary increment. For example, in FIG. 3, the transistor 308C may be twice as large as the transistor 308D, and so on. In some embodiments, one or more of the transistors 308A-308D may be sized to have a channel impedance that is 20 times greater than that of one or more others of the transistors 308A-308D, and so the overall impedance range of the variable impedance 300 may be set accordingly. In some embodiments, one or more of the transistors 308A-308D may be sized to have a channel impedance that is different from one or more others of the transistors 308A-308D by at least 50%. Control signals sent to the transistors 308A-308D may be calculated to result in a desired overall impedance of the variable impedance 300 based on the sizes and corresponding channel impedances of the transistors 308A-308D. In some embodiments, a portion of the transistors 308A-308D (e.g., 308A and 308B) may be sized to have a channel impedance that is smaller than the impedance 310. For example, the transistor 308A may have a channel impedance that is less than or equal to 25% of the impedance 310. In some embodiments, a portion of the transistors 308A-308D (e.g., 308C and 308D) may be sized to have a channel impedance that is larger than the impedance 310. For example, the transistor 308D may have a channel impedance that is greater than or equal to 5 times the impedance 310. It should be appreciated that, in some embodiments, some or all of the transistors 308A-308D may have substantially a same size.

The inventors have recognized and appreciated that the variable impedance 300 may be generally exposed to a smaller voltage swing at the first port 302 than the variable impedance 200. Accordingly, the variable impedance 300 may have a different variable impedance topology from the variable impedance 200 to have improved operating bandwidth while maintaining operation in the under-driven mode. As shown in FIG. 3, the transistors 308A-308D are implemented without series impedances. By not having series impedances, capacitances of the transistors 308A-308D have a smaller impact on the operating bandwidth of the variable impedance 300, and the overall size of the variable impedance 300 may be reduced. Additionally, the switched impedance array 308 may be configured to turn off the transistors 308A-308D when a large voltage swing is detected, such that only impedance 310 may be exposed to the large voltage swing, and operation in the under-driven mode may be maintained.

Figure 4:
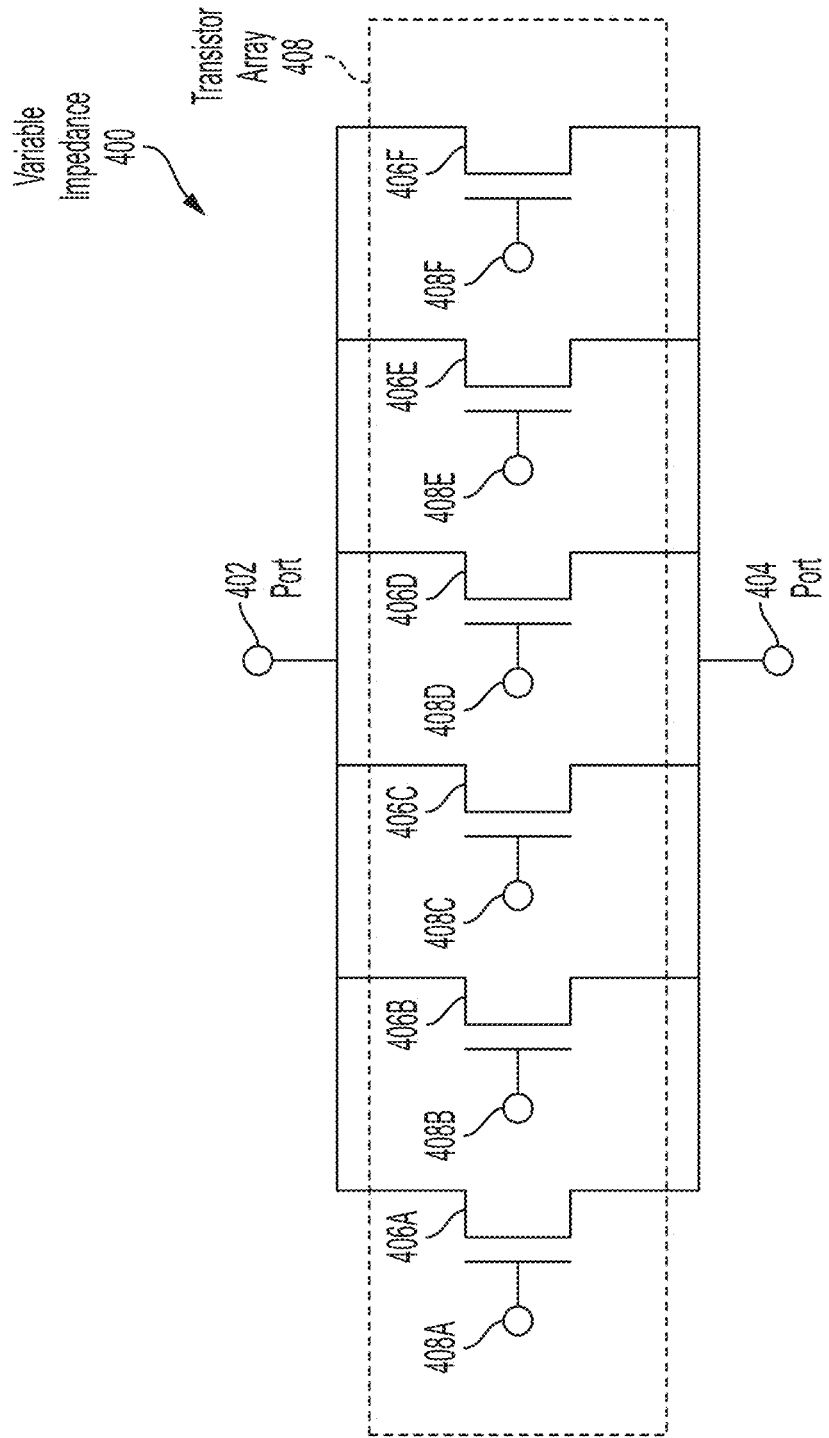
FIG. 4 is a schematic of another example variable impedance, according to some embodiments.

FIG. 4 shows another example variable impedance 400, having a third variable impedance topology different from the first and second variable impedance topologies described in connection with the variable impedances 200 and 300, that may be employed as any one or more of variable impedances 122A, 122B, 124A, 124B, 126A, and 126B in attenuator system 100. For example, the variable impedance 300 may be employed as variable impedances 126A and 126B in attenuator system 100. In FIG. 4, the variable impedance 400 comprises a transistor array 408 coupled between a first port 402 and a second port 404. The transistor array 408 comprises a plurality of transistors 406A-406F that are coupled in parallel. In contrast to the variable impedance 200 of FIG. 2A and the variable impedance 300 of FIG. 3, the transistors 406A-406F of the variable impedance 400 may not be coupled in series or parallel with impedances. Each of the transistors 406A-406F include a control terminal 408A-408F, respectively, that is configured to receive a control signal (e.g., from attenuator control circuit 110). The variable impedance 400 is configured with multiple impedance states corresponding to multiple possible impedances between the first port 402 and the second port 404. An impedance state may be selected from the multiple impedance states based on corresponding control signals received from the attenuator control circuit 110.

Similar to the variable impedances 200 and 300, the control signal for each of the transistors 406A-406F of the variable impedance 400 may have a voltage that varies between a plurality of levels to drive the respective transistor into a particular mode of operation, such as a cut-off mode of operation, an under-driven mode of operation, and an over-driven mode of operation.

Each of the transistors 406A-406F may have a different size allowing for a different channel impedance of the transistors 406A-406F. In some embodiments, different channel impedances of the transistors 406A-406F may allow for patterned arrangement of the transistors 406A-406F based on channel impedance, such as by binary increment. For example, in FIG. 4, the transistor 406B may be twice as large as the transistor 406A, and the transistor 406C may be twice as large as the transistor 406B, and so on. In some embodiments, one or more of the transistors 406A-406F may be sized to have a channel impedance that is 32 times smaller than one or more others of the transistor 406A-406B, and so the overall impedance range of the variable impedance 400 may be set accordingly. In some embodiments, one or more of the transistors 406A-406F may be sized to have a channel impedance that is different from one or more others of the transistors 406A-406F by at least 50%. Control signals sent to the transistors 406A-406F may be calculated to result in a desired impedance state of the variable impedance 400 based on the sizes of the transistors 406A-406F. It should be appreciated that, in some embodiments, some or all of the transistors 208A-208G may have substantially a same size.

The inventors have recognized and appreciated that the variable impedance 400 may be generally exposed to a smaller voltage swing at the first port 402 than the variable impedances 200 and 300. Accordingly, the variable impedance 400 may have a different variable impedance topology from the variable impedances 200 and 300 to have improved bandwidth while maintaining operation in the under-driven mode. In FIG. 4, the transistors 406A-406F are implemented without series or parallel impedances. By not having series or parallel impedances, capacitances of the transistors 406A-406F have a smaller impact on the operating bandwidth of the variable impedance 400, and a size of the variable impedance 400 may be even further reduced. In some embodiments, the transistors 406A-406F are sized such that channel impedances of the transistors 406A-406F may constitute at least 95% of a total impedance of the variable impedance 400 when at least some of the transistors 406A-406F are on. In some embodiments, the transistors 406A-406F are sized such that channel impedances of the transistors 406A-406F may constitute approximately 100% of a total impedance of the variable impedance when at least some of the transistors 406A-406F are turned on.

It should be appreciated that the transistors in the variable impedances 200, 300 and 400 of attenuator system 100 may be implemented with transistor circuits that comprise a plurality of transistors. An example of such a transistor circuit is illustrated in FIG. 5.

Figure 5:
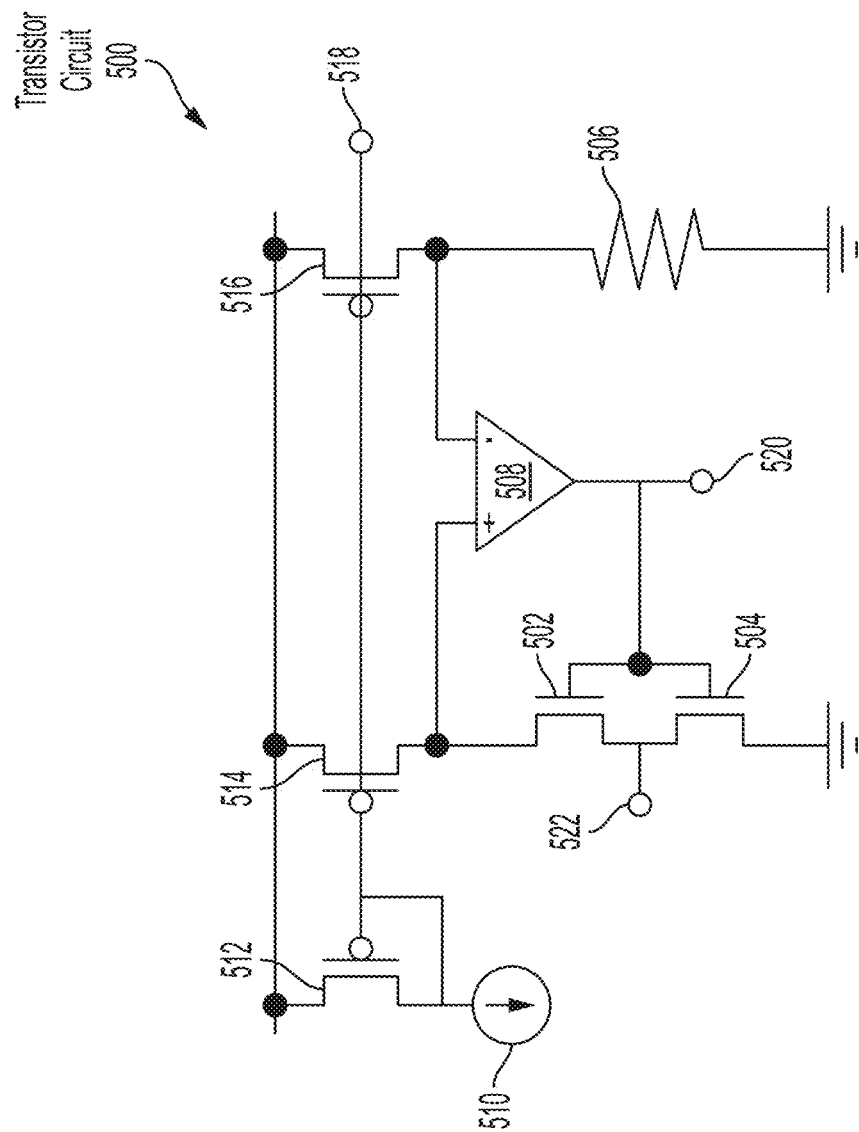
FIG. 5 is a schematic of an example transistor circuit, according to some embodiments.

FIG. 5 shows an example transistor circuit 500 that may be configured to set bias voltage levels for any or all of the variable impedances 200, 300 and 400 of the attenuator system 100 shown in FIGS. 2-4. Transistor circuit 500 comprises cascode transistors 502 and 504, a reference impedance 506, an amplifier 508, a reference current source 510, and current mirror transistors 512, 514 and 516. The transistor circuit 500 is configured to set and maintain a channel impedance of one or each of the cascode transistors 502 and 504 based on the reference current source 510 and the reference impedance 506. Nodes 520 and 522 may be coupled to the attenuator control circuit 110 for setting the bias voltage levels in the attenuator control circuit 110.

The cascode transistors 502 and 504 may be configured to regulate a biasing condition of a transistor of a switched impedance in the attenuator system 100. For example, the transistors 502 and 504 may be configured to regulate a biasing condition of one of the transistors 208A-208G in FIG. 2A, the transistors 308A-308D in FIG. 3, and/or the transistors 406A-406F in FIG. 4. For example, a node 522 coupled between channel terminals of the transistors 502 and 504 and a node 520 coupled to control terminals of the transistors 502 and 504 may be coupled to the attenuator control circuit 110 to set bias voltage levels for transistors of the variable impedances 200, 300 and 400. The transistors 502 and 504 may be configured to set the bias levels such that the transistors of the variable impedances 200, 300, and 400, when turned on, have approximately a same impedance as the transistor 502 and/or 504. For example, the bias voltage at node 520 may set the bias voltage level for control terminals of transistors of the variable impedances 200, 300, and 400, and the bias voltage at node 522 may set the bias voltage level for channel terminals of the transistors.

The reference impedance 506 and the reference current source 510 may be configured to set desired channel impedances of the cascode transistors 502 and 504, so as to set bias voltage levels at nodes 520 and 522 for transistors of the variable impedances 200, 300, and 400 such that, when turned on, the transistors have an impedance approximately equal to the reference impedance 506. For example, the reference impedance 506 may have a set impedance, and the reference current source 510 may be programmed to provide a reference current through each of the reference impedance 506 and the cascode transistors 502 and 504 via the current mirror transistors 512, 514 and 516. Inputs of the amplifier 508 are coupled to the cascode transistors 502 and 504 and to the reference impedance 506, with an output of the amplifier 508 coupled to control terminals of the cascode transistors 502 and 504. When the reference current flows through the reference impedance 506 and the cascode transistors 502 and 504, voltages at the inputs of the amplifier 508 indicate an impedance difference between the cascode transistors 502 and 504 and the reference impedance 506. According to the equation V=IR, if the cascode transistors 502 and 504 and the reference impedance 506 receive the same current, the voltages at the inputs of the amplifier 508 are substantially equal if the impedance formed by channel impedances of the cascode transistors 502 and 504 is substantially equal to the reference impedance 506. If the impedances are not substantially equal, the amplifier 508 senses the voltages at the inputs and amplifies a difference between the voltages to produce a bias voltage at the control terminals of the transistors 502 and 504, adjusting the channel impedances of the cascode transistors 502 and 504 until the voltages at the inputs are substantially equal. Thus, the amplifier is configured to maintain a bias of the cascode transistors 502 and 504 such that the channel impedances of the cascode transistors 502 and 504 are substantially equal to the reference impedance. In some embodiments, the channel impedance of the cascode transistors 502 and 504 may be within 5% of the reference impedance. It should be appreciated that, in some embodiments, the amplifier may be configured to maintain a bias of the transistor 502 such that the channel impedance of the transistor 502 is substantially equal to the reference impedance. In some embodiments, the channel impedance of the transistor 502 may be within 5% of the reference impedance. In some embodiments, a capacitor may be included between node 520 and one of the inputs of the amplifier 508 to stabilize a feedback loop of the amplifier 508.

It should be appreciated that some embodiments include only one of the cascode transistors 502 and 504. For example, a first channel terminal of the transistor may be coupled to the current mirror transistor 514 and a second channel terminal of the transistor may be coupled to ground.

Figure 6:
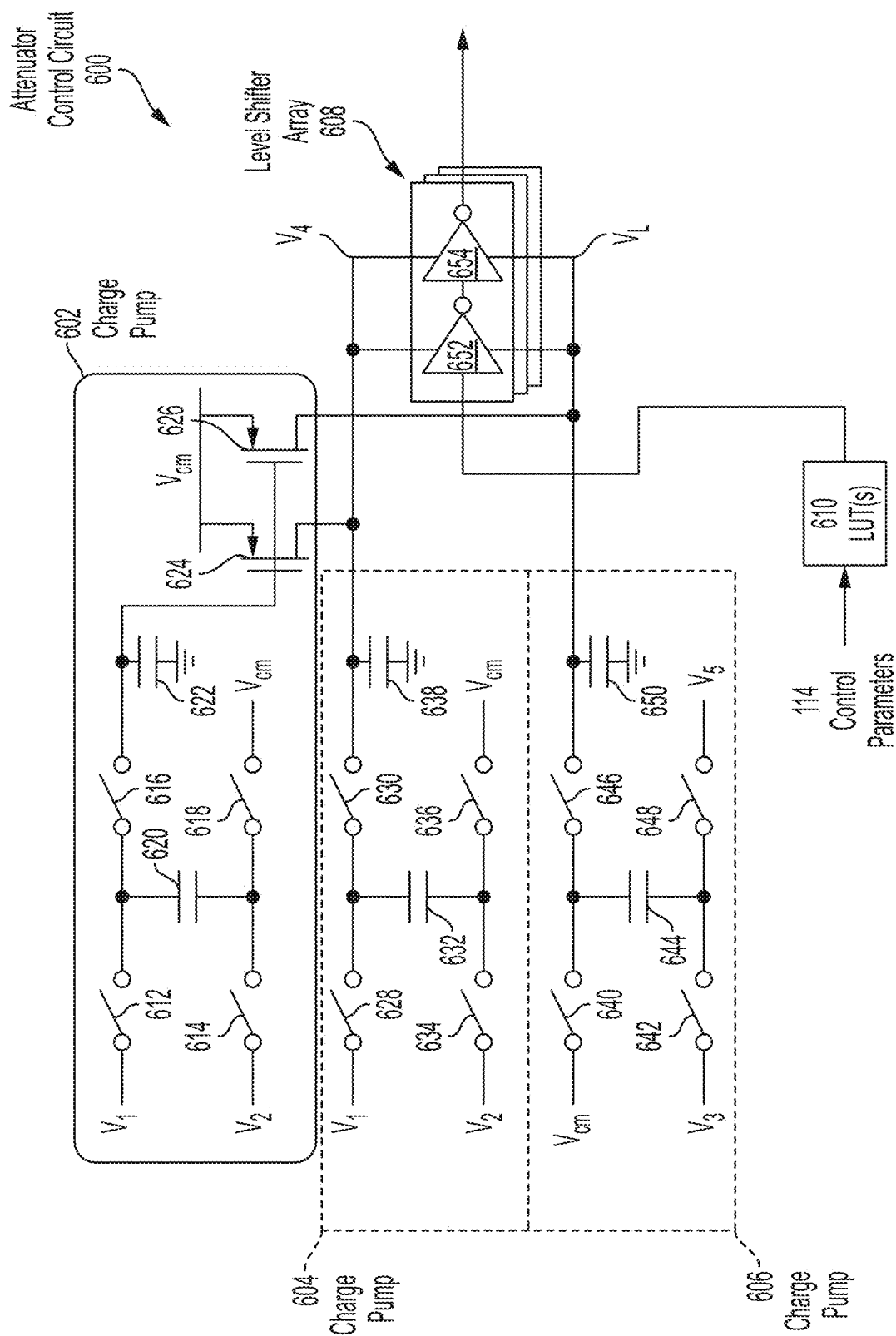
FIG. 6 is a schematic of an example attenuator control circuit, according to some embodiments.

FIG. 6 shows an example attenuator control circuit 600 that may be employed as the attenuator control circuit 110 in the attenuator system 100. As shown, the attenuator control circuit 600 includes charge pumps 602, 604, and 606 that are configured to generate a set of bias voltages (shown as a logic high voltage $V_H$ and a logic low voltage $V_L$) for a level shifter array 608 based on voltages $V_1$, $V_2$, $V_3$, a common-mode voltage $V_{cm}$. The level shifter array 608 may be coupled to transistors of the variable impedances 200, 300 or 400 of the attenuator system 100. The attenuator control circuit 600 also includes one or more look up tables (LUTs) 610 configured to decode control parameters 114 received from an external controller coupled to the attenuator system 100, and to issue commands to the level shifter array 608 to select one of the logic high voltage $V_H$ and the logic low voltage $V_L$ for applying to the transistor of the variable impedance controlled by the attenuator control circuit 600.

The attenuator control circuit 600 may receive the voltages $V_1$, $V_2$, and $V_3$ from a transistor circuit such as transistor circuit 500 of the attenuator system 100, or from an external controller. For example, the voltages $V_1$ and $V_2$ may be set from regulated bias voltages of transistors 502 and 504 of the transistor circuit 500 based on the reference impedance 506. The voltage $V_3$ may be a predetermined value calculated based on a voltage at which the control terminal of the transistor should be held when the transistor is turned off. For example, the voltage $V_3$ may be set at a lowest voltage of the attenuator system 100 to minimize leakage from transistors controlled by the attenuator control circuit 600. The attenuator control circuit 600 may receive the common-mode voltage $V_{cm}$ from the common-mode extraction circuit 108 of the attenuator system 100. For example, the voltage $V_{cm}$ may be held steady at the capacitor 120 coupled between the impedances 116 and 118 of the common-mode extraction circuit 108.

The charge pump 604 includes switches 628, 630, 634, and 636, as well as capacitors 632 and 638, and is configured to receive the voltages $V_1$ and $V_2$, as well as the common-mode voltage $V_{cm}$ and to output the logic high voltage $V_H$ to the level shifter array 608. In some embodiments, the voltage $V_1$ may be a desired bias voltage for a gate terminal of a FET controlled by the attenuator control circuit 600 and the voltage $V_2$ may be a desired bias voltage for a source terminal of the FET. During a first portion of each switch cycle, the capacitor 632 may be coupled between the voltages $V_1$ and $V_2$ so as to be charged with the difference between the voltages $V_1$ and $V_2$. During a second portion of each switch cycle, the capacitor 632 may be coupled between the common-mode voltage $V_{cm}$ and the capacitor 638 so as to be boosted by the voltage $V_{cm}$ and applied to the capacitor 638. The resulting voltage across the capacitor 638, represented by equation (3) as the logic high voltage $V_H$, may be held steady for the level shifter array 608. Upon receiving a logic-high command from the LUT(s) 610, the level shifter array 608 may apply the logic high voltage $V_H$ to the transistor controlled by the attenuator control circuit 600.

$$V_H = V_1 - V_2 + V_{cm} \qquad (3)$$

The charge pump 606 includes switches 640, 642, 646, and 648, as well as capacitors 644 and 650, and is configured to receive the voltages $V_3$ and $V_5$, as well as the common-mode voltage $V_{cm}$ and to output the logic low voltage $V_L$ to the level shifter array 608. In some embodiments, the voltage $V_3$ may be a reference voltage calculated such that, at the logic low voltage $V_L$, the control terminal of the transistor controlled by the attenuator control circuit 600 is held below 0 V by the voltage $V_3$. The voltage $V_5$ may be the lowest DC voltage in the attenuator system 100 (e.g., $V_{SS}$). During a first portion of each switch cycle, the capacitor 644 may be coupled between the common-mode voltage $V_{cm}$ and the voltage $V_3$ so as to be charged with the difference between the common-mode voltage $V_{cm}$ and the voltage $V_3$. During a second portion of each switch cycle, the capacitor 644 may be coupled between the voltage $V_5$ and the capacitor 650 so as to be boosted by the voltage $V_5$ and applied to the capacitor 650. The resulting voltage across the capacitor 650, represented by equation (4) as the logic low voltage $V_L$, may be held steady for the level shifter array 608. Upon receiving a logic-low command from the LUT(s) 610, the level shifter array 608 may apply the logic low voltage $V_L$ to the transistor controlled by the attenuator control circuit 600.

$$V_L = V_{cm} - V_3 \quad (4)$$

The charge pump 602 includes switches 612, 614, 616, and 618, as well as capacitors 620 and 622, and is configured to receive the voltages $V_1$ and $V_2$ and the common-mode voltage $V_{cm}$. The charge pump 602 may be configured to produce the same resulting logic high voltage $V_H$ at the capacitor 622 as the charge pump 604 outputs to the level shifter array 608. However, rather than outputting the logic high voltage $V_H$, the charge pump 602 is configured to selectively output the common-mode voltage $V_{cm}$ to each of the logic high voltage $V_H$ and the logic low voltage $V_L$ inputs of the level shifter array 608 through the transistors 624 and 626, depending on whether the logic high voltage $V_H$ across the capacitor 622 less the common-mode voltage $V_{cm}$ is above a turn on threshold of the transistors 624 and 626.

The level shifter array includes logic components 652 and 654 each configured to receive the logic high voltage $V_H$ from the charge pump 604 and the logic low voltage $V_L$ from the charge pump 606, and also to receive commands from the LUTs 610. Based on commands received from the LUTs 610, the level shifter array may provide either the logic high voltage $V_H$ or the logic low voltage $V_L$ to a transistor controlled by the attenuator control circuit 600.

The inventors have recognized that transistors of the variable impedances 200, 300, and 400 may experience voltage stress during a start-up process of the attenuator system 100. For example, the logic high voltage $V_H$ and the logic low voltage $V_L$ may be low when the attenuator system 100 first starts up, but the common-mode voltage $V_{cm}$ may be high. A difference between the voltages to which the transistors are exposed may cause voltage stress to the transistors.

Accordingly, the charge pump 602 is configured to prevent transistors under control of the attenuator control circuit 600 from experiencing voltage stress during a start-up process of the attenuator system 100. For example, each of the logic high voltage $V_H$ and the logic low voltage $V_L$ inputs of the level shifter array 608 may be coupled via transistors 624 and 626 to the common-mode voltage $V_{cm}$ when the logic high voltage $V_H$ is not high enough to turn off the transistors 624 and 626. The transistors 624 and 626 may be FETs, and since source terminals of the FETs are coupled to the common-mode voltage $V_{cm}$, the FETs turn on when the source-gate voltage exceeds a threshold voltage of the transistors 624 and 626. Accordingly, transistors controlled by the attenuator control circuit 600 receive the common-mode voltage $V_{cm}$ at their control terminals as long as the logic high voltage $V_H$ is below the common-mode voltage $V_{cm}$ by at least the threshold voltage of the transistors 624 and 626, causing the transistors to turn off. When the voltage difference between the logic high voltage $V_H$ and the logic low voltage $V_L$ and the common-mode voltage $V_{cm}$ decreases below the threshold voltage level, the transistors 624 and 626 may turn off, allowing the level shifter array to apply the logic high voltage $V_H$ or the logic low voltage $V_L$ to the transistor according to the control parameters 114 received by the attenuator control circuit 600. Various aspects of the apparatus and techniques described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

Further, the attenuator systems described herein may be integrated into any of a variety of devices. For example, the attenuator systems described herein may be integrated into a radio frequency (RF) front-end circuit. In this example, the attenuator system may have an input coupled to one or more antennas and an output coupled to another component in the RF front-end circuit, such as an amplifier or a filter.

It should be appreciated that the above described transistors may be implemented in any of a variety of ways. For example, one or more of the transistors may be implemented as bipolar junction transistors or field-effect transistors (FETs), such as metal-oxide semiconductor field-effect transistors (MOSFETs), junction field-effect transistors (JFETs), and heterostructure field-effect transistors (HFETs). In instances where one or more transistors described herein are implemented as BJTs, the gate, source, and drain terminals described above for such transistors may be base, emitter, and collector terminals, respectively.

Additionally, it should be appreciated that the above described transistors may be implemented using p-type semiconductor devices such as PMOS and PNP transistors.

The terms "approximately," "about," and "substantially" may be used to mean within ±10% of a target value in some embodiments. The terms "approximately," "about," and "substantially" may include the target value. It should be appreciated that the terms "approximately," "about," and "substantially" may be used to refer to a range smaller than ±10% of a target value such as: ±5% of a target value, ±2.5% of a target value, and ±1% of a target value.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. An attenuator system, comprising:
   a variable impedance configured to provide an impedance from among a plurality of impedance states, the variable impedance comprising:
   a first port;
   a second port;
   a first transistor comprising first and second channel terminals coupled between the first port and the second port; and
   a second transistor comprising first and second channel terminals coupled between the first port and the second port; and
   a control circuit configured to control the variable impedance to a first impedance state of the plurality of impedance states at least in part by providing a first output voltage to a control terminal of the first transistor to turn the first transistor on;
   wherein the first transistor is configured to operate in an under-driven mode when turned on, and wherein, in the under-driven mode, a channel impedance of the first transistor is set by the first output voltage, the channel impedance varying by less than 5% with changes to a voltage across a channel of the first transistor.

2. The attenuator system of claim 1, wherein, when the first transistor is turned on, the first output voltage is either:
higher than voltages at each of the first and second channel terminals at least by a threshold voltage level of the first transistor; or
lower than voltages at each of the first and second channel terminals at least by a threshold voltage level of the first transistor.

3. The attenuator system of claim 1, wherein the first transistor is a field effect transistor, and wherein the under-driven mode is a triode mode.

4. The attenuator system of claim 3, wherein the variable impedance comprises a plurality of transistors including the first and second transistors, and wherein the plurality of transistors are sized such that channel impedances of the plurality of transistors constitute at least 95% of a total impedance of the variable impedance when at least some of the plurality of transistors are turned on.

5. The attenuator system of claim 4, wherein the control circuit is configured to control the variable impedance to a second impedance state of the plurality of impedance states at least in part by providing a second output voltage to the control terminal of the first transistor to turn the first transistor off.

6. An attenuator system, comprising:
a variable impedance configured to provide an impedance from among a plurality of impedance states, the variable impedance comprising:
a first port;
a second port;
a first switched impedance coupled between the first port and the second port, the first switched impedance comprising a first transistor; and
a second switched impedance coupled between the first port and the second port and coupled in parallel with the first switched impedance, the second switched impedance comprising a second transistor; and
a control circuit configured to control the variable impedance to an impedance state of the plurality of impedance states at least in part by providing a first output voltage to a control terminal of the first transistor to turn the first transistor on;
wherein the first transistor is configured to have a channel impedance constituting at least 10% of a total impedance of the first switched impedance when the first transistor is turned on.

7. The attenuator system of claim 6, wherein the control circuit is further configured to provide the first output voltage to the control terminal of the first transistor causing the first transistor to operate in a triode mode.

8. The attenuator system of claim 7, wherein the control circuit is further configured to:
control the variable impedance to a second impedance state of the plurality of impedance states at least in part by providing a second output voltage to the control terminal of the first transistor that causes the first transistor to operate in a cut-off mode; and
control the variable impedance to a third impedance state of the plurality of impedance states at least in part by providing the first output voltage to a control terminal of the second transistor to cause the second transistor to operate in the triode mode.

9. The attenuator system of claim 6, wherein the first and second switched impedances are configured such that, when the first output voltage is applied to the control terminals of the first and second transistors, the first transistor has a channel impedance that is different from a channel impedance of the second transistor by at least 50%.

10. The attenuator system of claim 6, further comprising a reference circuit having a reference impedance, an amplifier, and a reference transistor, wherein:
the amplifier is coupled to the reference transistor and the reference impedance and configured to set and maintain a bias of the reference transistor such that the channel impedance of the reference transistor is within 5% of the reference impedance, and
the reference circuit is coupled to the control circuit and configured to set the first output voltage based on the bias of the reference transistor.

11. An attenuator system, comprising:
an input configured to receive an input signal;
an output configured to provide an output signal;
an impedance network coupled between the input and the output and configured to generate the output signal at least in part by attenuating the input signal, the impedance network comprising:
a first variable impedance comprising a first transistor, the first variable impedance configured to have a first variable impedance topology;
a second variable impedance comprising a second transistor, the second variable impedance configured to have a second variable impedance topology different from the first variable impedance topology; and
a control circuit coupled to the impedance network and configured to control an impedance of the first variable impedance and the second variable impedance.

12. The attenuator system of claim 11, wherein:
the first variable impedance comprises a first plurality of transistors, including the first transistor, coupled in parallel between first and second ports of the first variable impedance, and the first variable impedance is configured to provide an impedance from among a first plurality of impedance states; and
the second variable impedance comprises a second plurality of transistors, including the second transistor, coupled in parallel between first and second ports of the second variable impedance, and the second variable impedance is configured to provide an impedance from among a second plurality of impedance states.

13. The attenuator system of claim 12, wherein:
the control circuit is configured to control the first variable impedance to a first impedance state of the first plurality of impedance states at least in part by providing a first output voltage to a control terminal of the first transistor of the first variable impedance that causes the first transistor to operate in a triode mode; and
the control circuit is configured to control the second variable impedance to a first impedance state of the second plurality of impedance states at least in part by providing the first output voltage to a control terminal of the second transistor of the second variable impedance that causes the second transistor to operate in a triode mode.

14. The attenuator system of claim 13, wherein the control circuit comprises a first charge pump circuit configured to generate the first output voltage and a second charge pump circuit configured to generate a second output voltage.

15. The attenuator system of claim 14, wherein the control circuit comprises a level shifter coupled to the first charge pump circuit and the second charge pump circuit, the level shifter being configured to selectively output the first output voltage or the second output voltage to the control terminals of the first and second pluralities of transistors of the first variable impedance and of the second variable impedance.

16. The attenuator system of claim 15, wherein:
the first variable impedance further comprises a first switched impedance, the first switched impedance comprising the first transistor coupled in series with an impedance; and
a channel impedance of the first transistor, when the first transistor is turned on, constitutes at least 10% of a total impedance of the first switched impedance.

17. The attenuator system of claim 16, wherein:
the second plurality of transistors are sized such that, when at least some of the second plurality of transistors are turned on, channel impedances of the second plurality of transistors constitute at least 95% of a total impedance of the second variable impedance.

18. The attenuator system of claim 17, wherein the impedance network further comprises a third variable impedance configured to provide an impedance from among a third plurality of impedance states, the third variable impedance configured to have a third variable impedance topology different from the first and second variable impedance topologies.

19. The attenuator system of claim 18, wherein the first variable impedance, the second variable impedance, and the third variable impedance are arranged in a pi pad topology or a T pad topology.

* * * * *